United States Patent
Ho et al.

(10) Patent No.: US 7,524,607 B2
(45) Date of Patent: Apr. 28, 2009

(54) WATER SOLUBLE NEGATIVE TONE PHOTORESIST

(75) Inventors: Bang-Chien Ho, Hsin-Chu (TW); Jian-Hong Chen, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 8 days.

(21) Appl. No.: 11/373,648

(22) Filed: Mar. 10, 2006

(65) Prior Publication Data

US 2006/0154177 A1    Jul. 13, 2006

Related U.S. Application Data

(62) Division of application No. 10/714,998, filed on Nov. 17, 2003, now Pat. No. 7,033,735.

(51) Int. Cl.
*G03F 7/038*    (2006.01)

(52) U.S. Cl. .................................. 430/270.1

(58) Field of Classification Search ....... None
See application file for complete search history.

(56) References Cited

U.S. PATENT DOCUMENTS 5,916,995 A * 6/1999 Park et al. ........... 528/104
6,110,641 A * 8/2000 Trefonas et al. .......... 430/270.1
6,800,415 B2 10/2004 Lu et al. .................. 430/270.1
2003/0077539 A1* 4/2003 Lu et al. .................. 430/270.1
2004/0069745 A1 4/2004 Ho et al. ........................ 216/41

FOREIGN PATENT DOCUMENTS

WO    WO 03/029900 A1 *    4/2003

\* cited by examiner

*Primary Examiner*—Cynthia Hamilton
(74) *Attorney, Agent, or Firm*—Thomas, Kayden, Horstemeyer & Risley

(57) ABSTRACT

A method is described for reducing the space width of holes in a first resist pattern and simultaneously removing unwanted holes to change the pattern density in the resulting second pattern. This technique provides holes with a uniform space width as small as 100 nm or less that is independent of pattern density in the second pattern. A positive resist is patterned to form holes with a first pattern density and first space width. A water soluble negative resist is coated over the first resist and selectively exposed to form a second patterned layer consisting of water insoluble plugs in unwanted holes in the first pattern and a thin water insoluble layer on the first resist pattern in unexposed portions. The plugs may form dense and isolated hole arrays while the thin insoluble layer reduces space width to the same extent in remaining holes in the second pattern.

4 Claims, 3 Drawing Sheets

WATER SOLUBLE NEGATIVE TONE PHOTORESIST

CROSS-REFERENCE TO RELATED APPLICATION

This application is a division of U.S. patent application Ser. No. 10/714,998, filed Nov. 17, 2003 now U.S. Pat. No. 7,033,735.

RELATED PATENT APPLICATIONS

This application is related to the following: Ser. No. 10/002,986, filing date Nov. 30, 2001; Ser. No. 10/005,806, filing date Dec. 5, 2001; Ser. No. 10/443,359, filing date May 22, 2003; and Ser. No. 10/268,586, filing date Oct. 10, 2002, all assigned to a common assignee.

FIELD OF THE INVENTION

The invention relates to a method of fabricating an integrated circuit in a semiconductor device. More particularly, the present invention relates to a method of reducing hole or trench sizes in a photoresist pattern and for optimizing the print density of said pattern.

BACKGROUND OF THE INVENTION

Photoresist patterning is a key step in the formation of integrated circuits in semiconductor devices. A photoresist, hereafter referred to as resist, is typically spin coated on a substrate, baked to form a film, and patternwise exposed by employing an exposure tool and a mask that contains a device pattern. Radiation is transmitted through transparent regions of the mask to selectively expose portions of the resist layer. The resist layer is developed in a media such as an aqueous base solution to produce a resist pattern on the substrate. Each technology generation or node in the microelectronics industry is associated with a particular minimum feature size in the resist pattern. As technology advances have been continuous in recent years, the minimum feature size requirement has rapidly shifted from 250 nm to 180 nm and then to 130 nm. New products are now being developed for a sub-100 nm technology node.

Some of the more common features that are printed in resist layers are contact or via holes and trenches which have a variety of pitches. In FIG. 1, a resist layer 2 is patterned on a substrate 1. In one region of the pattern, a pitch P1 is equal to the space width W1 of a feature such as hole 3a and the distance D1 separating hole 3a from an adjacent hole 3b. Another region of the pattern has a pitch P2 consisting of a space width W1 in a hole 3c and a distance D2 between hole 3c and an adjacent hole 3d. The ratio D1/D2 may vary from slightly more than 1 to a number as high as 10 or more. One of the problems associated with a typical patterning process is that space width W1 is dependent on pattern density. For example, space width W1 in an opening like hole 3c that is part of a dense array is printed at a different size than space width W1 for a semi-isolated hole 3a or an isolated hole in the same pattern even though the space width on the mask used to print the pattern is the same for all of the holes 3a-3d. As a result, optical proximity corrections (OPC) are required on the mask design that will enable the lithography process to print dense and isolated holes with equal space widths W1. OPC can be cumbersome to generate and a period of one or two months may be necessary before a new mask with OPC corrections is available. It is desirable to have an alternative method in which the pattern density in a resist pattern is adjusted so that holes 3a-3d are all printed with the same space width W1.

The minimum resolution that can be achieved in a printed pattern is defined by the equation $R = k\lambda/NA$ where R is the minimum feature size that can be resolved, k is a constant, $\lambda$ is the exposure wavelength, and NA is the numerical aperture of the exposure tool. While exposure tools having mercury lamps that emit g-line (436 nm) or i-line (365 nm) radiation have been widely used in the industry, the trend in newer technologies is to move to shorter wavelengths such as 248 nm from KrF excimer lasers or 193 nm from ArF excimer lasers to achieve smaller feature sizes approaching 100 nm. In the near future, 157 nm radiation from $F_2$ lasers and 13 to 14 nm wavelengths from extreme ultraviolet radiation (EUV) sources will be available for printing sub-100 nm features. Projection electron beam (e-beam) tools are also being developed for sub-100 nm applications.

A method of forming smaller contact holes by a double exposure process described in U.S. Pat. No. 5,573,634 may be applied to any UV wavelength since it lowers the amount of diffracted light from a single exposure. The technique avoids exposing adjacent holes on a single mask which produces a significant background intensity between the holes in the aerial image that reaches the resist layer.

Commercial resist compositions are available in two general types that are referred to as positive tone and negative tone formulations. In positive tone or positive resist, exposed regions become soluble in a developer solution that is typically an aqueous base. Unexposed regions in the film stay insoluble in the developer and remain on the substrate. For negative resists, exposed regions become insoluble in a developer while the unexposed regions remain soluble and are washed away. The resist solution is spin coated on a substrate and baked to form a film thickness that may vary from about 0.2 microns to several microns. As a general rule, the thickness is about 3 or 4 times the size of the minimum space width or line width. Therefore, to print a 100 nm contact hole, a 300 to 400 nm thick film is typically applied in order to have a patterning process latitude that is manufacturable.

Most state of the art positive and negative resists operate by a chemical amplification mechanism in which a photosensitive component absorbs energy from the exposing radiation and generates a strong acid. One acid molecule is capable of removing many polymer protecting groups in a positive resist mechanism or initiating several crosslinking reactions in a negative resist mechanism. A post-exposure bake is usually required to drive the reaction to completion within a few minutes so that the process is compatible with a high throughput manufacturing scheme. Chemically amplified (CA) resists are especially useful with Deep UV (248 nm) radiation or with sub-200 nm exposure wavelengths. Another important feature of a CA resist is that in addition to a polymer, solvent, and photoacid generator component, the CA resist also contains a quencher which is usually a base such as an amine that controls acid diffusion in the exposed film and acts as an acid scavenger in the resist solution.

The negative resist imaging process may involve a crosslinking mechanism or a polarity change to render the exposed regions insoluble in developer. Crosslinking occurs when a photo generated acid catalyzes bond formation between two polymer chains or between a polymer and an additive containing reactive groups. Depending on the molecular weight (MW) of the original polymers, a few crosslinks are all that might be needed to convert a soluble polymer into an insoluble network of polymers. This solubility difference is the basis for forming a pattern in an exposed negative tone film.

Traditionally, resists have been formulated in organic solvents, but recently water based formulations that are more environmentally compatible have been developed. U.S. Pat. No. 5,017,461 describes a water soluble negative tone composition based on a polyvinyl alcohol (PVA) and an acid generator that is a diazonium salt. An hydroxyl group on the polymer reacts with the diazonium salt to form an ether and liberate nitrogen and HCl. When the film is heated, HCl induces the polymer to lose a molecule of water and form an alkene that is insoluble in water developer. This is an example of a negative resist based on a polarity change.

Another water soluble negative resist that does not rely on a crosslinking mechanism is provided in U.S. Pat. No. 5,998,092. A photoacid reacts with an acetal group on a polymer side chain to produce a B-keto acid that loses $CO_2$ to form a polymer which is insoluble in aqueous base developer. This composition is especially useful in avoiding swelling in aqueous developer.

A water soluble resist that is compatible with a crosslinking mechanism is described in U.S. Pat. No. 5,948,592 in which a calcium salt of an organic acid is added to an aqueous form of casein, a photosensitive material, and optionally, a crosslinker. An acetate, lactate, or formate salt is used to improve photosensitivity, resolution, and etch resistance in a resist pattern that may be hardened by baking from 150° C. to 300° C.

Individual components of negative resists have been developed that possess water solubility as an added property. For example, a water soluble sugar is claimed as an improved crosslinker in related U.S. Pat. Nos. 5,532,113 and 5,536,616. This crosslinker is used in combination with a p-hydroxystyrene polymer and a triphenylsulfonium salt that are not soluble in water and have an optical absorbance that is most suitable for 248 nm exposures. The pattern is developed in aqueous base. In U.S. Pat. No. 5,648,196, a water soluble photoacid generator (PAG) is described and is formulated with a p-hydroxystyrene polymer and a water soluble sugar. Either water or aqueous base developer is acceptable. The PAG is preferably a dimethylarylsulfonium salt wherein the aryl group has one or more hydroxy substituents.

Still another crosslinking formulation is provided in U.S. Pat. No. 5,858,620 in which a water soluble polymer and crosslinker are coated on a patterned layer containing acid that has a hole with a space width of about 400 nm. The patterned layer is either baked at 150° C. to cause acid diffusion that induces crosslinking in the water soluble layer or the patterned resist is exposed and baked to drive acid into the top layer. In either case, a crosslinked coating is formed on the patterned resist that effectively shrinks the space width to about 300 nm. In related art, U.S. Pat. No. 6,319,853 describes a crosslinking mechanism to shrink a 200 nm space to a 110 nm space width. However, the crosslinking layer does not contain a quencher and the extent of acid diffusion is determined by only the bake temperature and time which may be difficult to reproduce uniformly across a wafer.

Therefore, a improved method that offers a higher degree of control in shrinking space widths which is desirable for new technologies involving hole patterns with space widths approaching 130 nm or smaller is needed. A process that is able to shrink space widths of holes in addition to adjusting pattern density is especially appealing to manufacturing since it provides more flexibility in the overall scheme of fabricating semiconductor devices.

SUMMARY OF THE INVENTION

One objective of the present invention is to provide a method of optimizing print density in a resist pattern.

A further objective of the present invention is to provide a method of shrinking the space width of a hole or trench that has been patterned by UV radiation including sub-200 nm wavelengths or by e-beam exposure where the space width has a size that can be as small as 130 nm or less.

A still further objective of the present invention is to provide a method for adjusting a resist pattern print density that is compatible with chemically amplified resists and conditions for processing these resists.

Yet another objective of the present invention is to provide a negative tone resist that may be coated over an existing photoresist pattern to simultaneously adjust the print density in the pattern and shrink the space width of holes or trenches in the pattern.

These objectives are achieved in one embodiment with a lithography process that involves a first mask pattern for printing fine holes or trenches in a resist. The mask may be an attenuated phase shifting mask (att-PSM), an alternating PSM (alt-PSM), or a binary mask and the lithography process may include resolution enhancement techniques such as off-axis illumination and scattering bars in the mask design. A positive resist layer is preferably coated on a substrate and is exposed by 248 nm, 193 nm, 157 nm, or EUV radiation followed by a post-expose bake and development in an aqueous base. Optionally, e-beam exposure is used to form the first patterned resist layer. The first patterned resist layer has holes with a first space width and a first pattern density.

A second resist layer comprised of a water soluble negative resist is coated over the first patterned resist layer. The negative resist is exposed with radiation through a second mask pattern to form crosslinked regions in the negative resist in unwanted holes in the first patterned resist layer. The so called unwanted holes will be eliminated during a subsequent pattern transfer step that will reduce the pattern density of the resulting pattern in the substrate. During the post-expose bake (PEB) step, residual acid in the first patterned resist layer diffuses into adjacent regions including unexposed regions of the negative resist and induces a crosslinking reaction that produces a thin crosslinked layer on the first patterned resist layer. In addition, further crosslinking occurs in the crosslinked regions formed by the negative resist exposure to generate crosslinked plugs in unwanted holes of the first patterned layer. The negative resist is then developed with a water or aqueous base solution to produce plugs in unwanted holes of the first patterned resist layer and a thin crosslinked layer over the remaining portion of the first patterned layer.

The second patterned layer comprised of the thin crosslinked layer and the crosslinked plugs has holes with a second space width that is less than the first space width in the first patterned layer. The thin crosslinked layer effectively shrinks the size of unplugged holes in the first patterned resist layer by forming a liner on the sidewalls of the unplugged holes. The thickness of the thin crosslinked layer and therefore the second space width may be controlled by the amount of quencher in the negative resist and the PEB conditions. The second patterned layer serves as an etch mask while the hole pattern in the second patterned layer is transferred into the substrate. The pattern density is adjusted since the crosslinked plugs prevent unwanted holes from being transferred into the substrate during the etch step. The first patterned resist layer and the second patterned resist layer are stripped and the substrate is ready for subsequent processing.

The invention also encompasses a novel negative tone water soluble photoresist that is particularly useful as the negative resist described in the first embodiment. In a preferred composition, the negative resist is comprised of a water/isopropanol (IPA) solvent mixture, a poly(vinylacetal), ethyleneurea as crosslinker, a photoacid generator (PAG) that may be a water soluble onium salt, a triazine, an imidosulfonate, or a diazonium sulfonate, and a quencher that is preferably an amine or a nitrogen containing compound. The PAG preferably generates a strong acid such as a sulfonic acid upon exposure to one or more wavelengths in the range of from about 10 nm to about 300 nm. The strong acid catalyzes a chemical amplification mechanism so that the exposure dose is low enough for a high throughput lithographic process. The PAG should also be thermally stable during processing of the negative resist and should not react with the quencher while in solution or in the unexposed resist film. The quencher is preferably a compound or salt that will not bake out of the spin coated negative resist film during bake processes. A ratio of PAG to quencher in the formulation is employed that will enable a low exposure dose but still allow acid diffusion into unexposed regions to be controlled. The amount of each component in the negative resist is typically optimized to provide a pattern that has vertical sidewalls and a good exposure and focus latitude during the patterning step.

In a second embodiment, a hole or trench pattern is formed in a first patterned resist layer according to a method described in the first embodiment. The first patterned resist layer has holes with a first space width and a first pattern density. A water soluble negative resist consisting of a polymer having polar functionality such as hydroxy groups, a PAG, a water based solvent, and a quencher is coated over the patterned layer. The negative resist is exposed with radiation through a second mask pattern that causes a reversal in polymer polarity in the negative resist within unwanted holes in the first patterned resist layer. During the post-expose bake (PEB) step, residual acid in the first patterned resist layer diffuses into adjacent regions including unexposed regions of the negative resist and induces a reaction that generates a non-polar polymer. As a result a thin layer of water insoluble negative resist with a non-polar polymer is formed on the first patterned layer. In addition, the acid formed by the negative resist exposure causes a further reaction within unwanted holes of the first patterned layer and produces water insoluble plugs with a polymer of reversed polarity.

The remaining water soluble negative resist layer is then removed by developing with a water solution to produce a second patterned resist layer comprised of water insoluble plugs in unwanted holes of the first patterned resist layer and a thin water insoluble negative resist with a polymer of reversed polarity on the remaining portion of the first patterned resist layer. The second patterned resist layer has holes with a second space width that is less than the first space width in the first patterned layer.

The second patterned resist layer effectively shrinks the size of unplugged holes in the first patterned resist layer by forming a liner on the sidewalls of the unplugged holes. The thickness of the second patterned resist layer and therefore the second space width can be controlled by the amount of quencher in the water soluble negative resist and the PEB conditions. The second patterned resist layer serves as an etch mask while the hole pattern in the second patterned resist layer is transferred into the substrate. The pattern density is adjusted since the water insoluble plugs prevent unwanted holes from being transferred into the substrate during the etch step. The first patterned resist layer and the second patterned resist layer are stripped and the substrate is ready for subsequent processing.

DETAILED DESCRIPTION OF THE INVENTION

The present invention is described with reference to the drawings which are not necessarily drawn to scale and are provided by way of example and not intended to limit the scope of the invention. In the first embodiment as illustrated in FIGS. 2-5, a method is described for shrinking the space width of holes in a resist pattern while simultaneously reducing the pattern density of the holes in the pattern. This method allows holes with the same space width but different pattern densities to be formed in a pattern in a resist layer that is transferred into a substrate. The holes may be vias, contact holes, trenches, or other features which have a space width to be decreased and a pattern density to be reduced.

Figure 2:
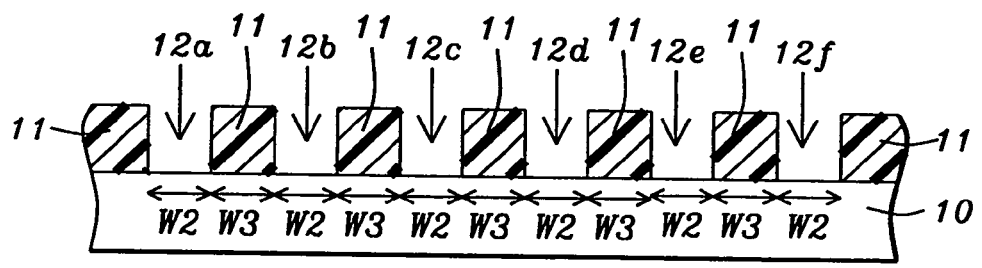
FIGS. 2-5 are cross-sectional views of various process steps illustrating one embodiment of the present invention in which the space width and pattern density of holes in a first resist pattern are reduced in a second pattern formed in a substrate.

Referring to FIG. 2, a substrate 10 is provided that may contain active and passive devices in a substructure that is not shown in order to simply the drawing and direct attention to the present invention. In one embodiment, an anti-reflective coating or ARC (not shown) is formed on substrate 10 in order to control reflectivity during a subsequent resist patterning process. The ARC may be an inorganic material such as silicon nitride or silicon oxynitride that is deposited by a chemical vapor deposition (CVD) process or the like or the ARC may be an organic layer that is obtained by spin coating and baking a commercially available solution. Alternatively, an ARC may be omitted and a resist layer is coated directly on the substrate in the next step.

A positive tone resist from a commercial supplier is spin coated and baked to form a first resist layer 11 which normally has a thickness in the range of about 2000 to 10000 Angstroms. The thickness is usually determined by the minimum feature size in the device pattern to be printed in the first resist layer 11. However, the thickness of the first resist layer 11 is also influenced by the etch rate ratio of first resist layer 11 to substrate 10 and the depth to which a hole in a subsequently formed resist pattern is etch transferred into substrate 10 in a later step represented in FIG. 5. As a general rule, the thickness of a resist layer is about 3 to 4 times the size of the minimum space width in the resulting resist pattern which in this embodiment is the space width $W_2$ of holes 12a-12f in the first patterned resist layer 11.

The selection of an appropriate resist composition to form the first resist layer 11 depends on the dimension of the smallest feature to be printed in the first resist layer. A Deep UV resist that is exposed with a single wavelength (248 nm) from an excimer laser or with a broadband (240-260 nm) source is preferred for printing features such as holes having a space width from about 130 nm to about 300 nm while a so called 193 nm resist is exposed with a 193 nm wavelength from an ArF excimer laser to print features with a space width from about 100 nm to about 130 nm. An i-line resist that is exposed with a 365 nm wavelength is generally employed for forming patterns when the minimum space width is greater than approximately 300 nm. Although the drawings for this embodiment depict a single layer imaging scheme, it should be understood that a bilayer or trilayer scheme having a positive tone resist as the top layer is also included within the scope of this invention.

The first resist layer 11 is exposed through a first mask (not shown) that transmits an aerial image which projects a hole pattern on the first resist layer 11. The first mask may be an Att-PSM or Alt-PSM, or an Att-PSM, Alt-PSM, or binary mask with scattering bars to increase the process window of the patterning method. Radiation from an exposure source (not shown) passes through transparent regions of the mask to expose selected regions of the first resist layer 11. Although 193 nm, 248 nm, and 365 nm exposure tools are preferred for most current lithography applications, it is understood that any exposure wavelength in the range from 10 nm to about 600 nm is included in the scope of this invention. Optionally, an electron beam exposure tool can be used to form a pattern in the first resist layer 11. This e-beam process may involve a direct write technique or a projection e-beam tool.

In a preferred embodiment when the exposure involves Deep UV or sub-200 nm wavelengths, the first resist layer 11 is a chemically amplified resist and a post exposure bake (PEB) at temperatures from about 90° C. to 150° C. is performed following exposure to accelerate an acid catalyzed reaction. A developer that is typically an aqueous base solution is applied to substrate 10 to form a first patterned layer 11 with holes 12a-12f having a space width $W_2$ and separated by a distance $W_3$ where the ratio $W_3/W_2$ may vary from approximately 1 for a high pattern density to a number of about 10 or more for a low pattern density. Patterns with intermediate $W_3/W_2$ ratios are referred to as semi-dense or semi-isolated.

In many applications, it is desirable to print holes with the same space width but with different pattern densities. In prior art methods when a single mask having holes of equal space width is used to print a pattern with different pattern densities, isolated holes (low pattern density) are usually printed with a smaller space width than dense arrays of holes (high pattern density). In the present invention, holes with equal space width are printed with a first pattern density in a first resist layer and then unwanted (dummy) holes are removed so that the remaining holes in a second pattern in a second resist layer which are transferred into a substrate have equal space widths but different pattern densities. Furthermore, a smaller space width may be achieved in the holes formed in the substrate than in a conventional process where a pattern is a single resist layer that is subsequently etch transferred into the substrate.

Figure 1:
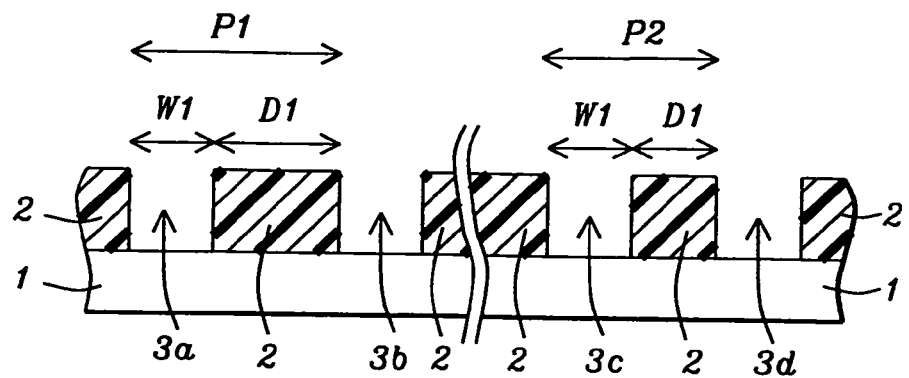
FIG. 1 is a cross sectional view of a pattern that shows a resist pattern having different pitches at different locations on a substrate.

With the usual method of generating two or more pattern densities from one exposure as shown in FIG. 1, the space width $W_1$ varies. OPC corrections are often applied in prior art to adjust various portions of the mask pattern to enable a more uniform space width $W_1$ in the resist pattern. In some cases the mask compensation is not possible because of space constraints in the mask design or because of other complicating factors. The method of this embodiment is particularly useful for generating a more uniform space width in holes that have different pattern densities without the need for OPC.

Referring to FIG. 2, the holes 12a-12f are formed with the same space width $W_2$ in a first patterned resist layer 11 where they are separated by a constant distance $W_3$ and have a first pattern density. It is understood that the pattern may be further comprised of other regions (not shown) having holes with a space width $W_X$ that are separated from one another by a distance $W_Y$ where $W_X$ may or may not be equal to $W_2$ and $W_Y$ may or may not be equal to $W_3$. In one embodiment, $W_3/W_2$ may be about 1 so that holes 12a-12f are in a dense array with a high pattern density. As mentioned previously, there may be arrays of holes (not shown) in other regions having a space width $W_X$. The method of this embodiment provides a means of reducing all space widths $W_2$ and $W_X$ by a constant amount while reducing the pattern density of holes in selected regions that may or may not include $W_X$. Alternatively, holes 12a-12f may be part of a semi-dense or isolated array where $W_3/W_2$ is significantly greater than 1.

In the first embodiment, the pattern density of a region 18a that includes holes 12a, 12b and the pattern density of a region 18c with holes 12e, 12f will be reduced by removing holes 12b, 12e in a second patterned layer that will be subsequently be formed over the first patterned layer 11. Meanwhile, the pattern density of a region 18b with holes 12c, 12d will remain unchanged after a second patterned layer is formed. Note that a region is defined as a portion of the substrate 10 and layers overlying that portion of substrate. From a top-down view (not shown), a region has a width and a length and comprises an area as small as approximately 1 square micron to as large as hundreds of square microns. Furthermore, a first region may have a different area than a second region. Those skilled in the art will appreciate an alternative embodiment wherein a plurality of regions each with a plurality of holes may be present in a first patterned resist layer 11 on the substrate 10. To simplify the drawings, only three regions with two holes in each region are shown in the first embodiment.

Figure 3:
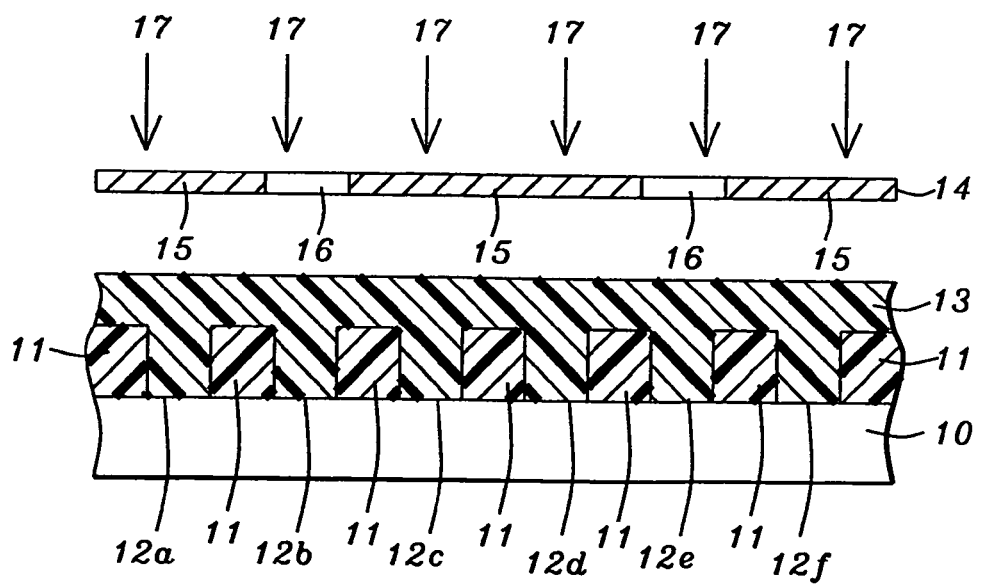

In FIG. 3, a water soluble negative resist comprised of a polymer, a crosslinker, photoacid generator (PAG), and a quencher which is typically a non-nucleophilic base such as an amine or a nitrogen containing compound is coated on the first patterned resist layer 11 and baked to form a water soluble negative resist layer 13. One particular formulation that is preferably employed to form the water soluble negative resist layer 13 is comprised of a water/IPA solvent with 4% to 8% by weight of poly(vinylacetal), 0.5% to 2% by weight of ethyleneurea as crosslinker, 0.01% to 0.1% by weight of a PAG, and 1 to 30 ppm of a quencher. The preferred polymer which is a poly(vinylacetal) has the following structure:

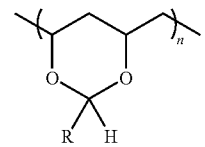

wherein R is an alkyl group and n indicates the degree of polymerization.

The preferred crosslinker in the water soluble negative resist is ethyleneurea which has the structure:

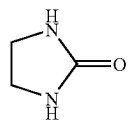

but other ureas and water soluble crosslinkers such as glycoluril shown below may be used in the formulation.

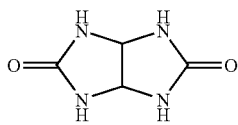

An appropriate PAG is selected to function at any of the exposure wavelengths mentioned previously that include 365 nm, 248 nm, 193 nm, 157 nm, and 13 to 14 nm (EUV). PAGs that are sensitive to optical wavelengths are also sensitive to e-beam exposure. The PAG preferably generates a strong acid such as a sulfonic acid upon exposure which catalyzes a chemical amplification mechanism so that the exposure dose is low enough for a high throughput lithographic process. The PAG should also be thermally stable during processing of the negative resist and should not react with the quencher while in solution or in the unexposed resist film. In some cases, especially for 365 nm exposures, a sensitizer may be added to absorb energy from the exposing radiation and then transfer energy to the PAG. The PAG may be a water soluble onium salt, a triazine, an imidosulfonate, or a diazonium sulfonate, for example.

The quencher is usually an amine or contains a basic nitrogen moiety that does not react with the polymer or PAG but traps trace amounts of acid that might cause unwanted reactions while the resist is stored as a water solution. Appropriate quenchers depend on the PAG and polymer composition. Furthermore, the quencher is preferably a compound or salt that will not bake out of the coated resist film during bake processes and limits acid diffusion in the resist film. A ratio of PAG to quencher in the formulation is employed that will enable a low exposure dose but still allow acid diffusion into unexposed regions to be controlled. The amount of each component in the negative resist is typically optimized to provide a pattern that has vertical sidewalls and a good exposure and focus latitude.

The water soluble negative resist is preferably spin coated from a water solution and does not mix with first patterned resist layer 11 during the coating and baking operations to form the water soluble negative resist layer 13. The water soluble negative resist layer 13 is baked at a temperature in the range of about 80° C. to 150° C. in order to dry the film after spin coating and is then exposed through a second mask 14. In one embodiment, the second mask 14 is a binary mask comprised of a pattern that includes primarily opaque regions 15 and small transparent regions 16 corresponding to locations of the unwanted holes 12b, 12e in FIG. 3. The second mask 14 may be further comprised of scattering bars to improve the resolution and process window of the patterning step. Alternatively, the second mask 14 is an att-PSM or alt-PSM in which the region 15 transmits light that is 180° out of phase with light transmitted through the region 16. Although 193 nm, 248 nm, and 365 nm exposure tools are preferred for most current lithography applications, it is understood that any wavelength 17 in the range from 10 nm to about 600 nm may be used for this step. Furthermore, the exposure may include a resolution enhancement technique (RET) such as off-axis illumination to increase the process window of the patterning step.

Figure 4:
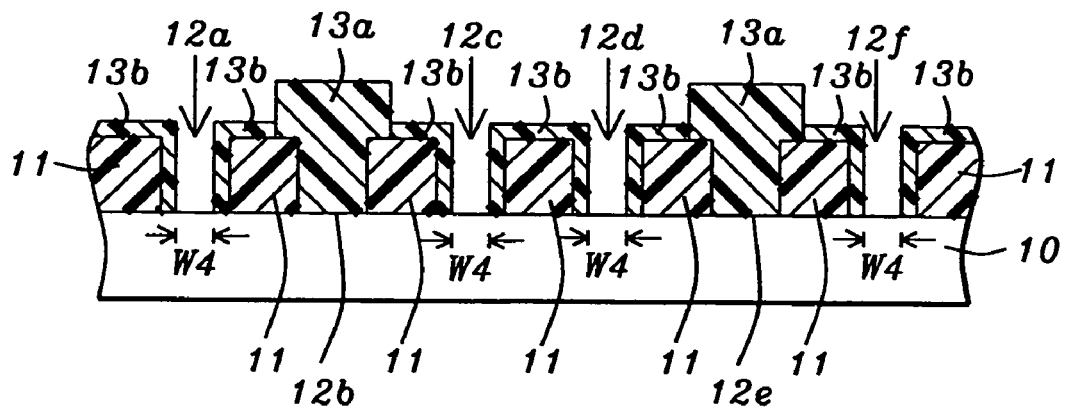

Referring to FIG. 4, the water soluble negative resist layer 13 is crosslinked in exposed regions and following a PEB step and treatment with a water or aqueous base developer is transformed into a crosslinked plug 13a. The PAG generates a strong acid in exposed areas which catalyzes a reaction between the polymer and crosslinker to form a crosslinked network that is no longer soluble in water. Therefore, when a developer is applied to the substrate 10 following the PEB step, only regions of the negative resist layer 13 that have not been crosslinked are removed. A thin crosslinked layer 13b is formed because residual acid in the first patterned resist layer 11 diffuses into adjacent regions of the water soluble resist layer 13 during the PEB step to induce a crosslinking reaction. The quencher loading in the water soluble negative resist layer 13 may be adjusted downward if a greater thickness of the thin crosslinked layer 13b is desired or the quencher concentration is increased if a smaller thickness of the thin crosslinked layer 13b is required. PEB time and temperature may also be changed to control the thickness of the thin crosslinked layer 13b which determines the amount of shrinkage in holes 12a, 12c, 12d, 12f.

A second patterned layer comprised of the crosslinked plugs 13a and the thin crosslinked layer 13b is thereby formed on the first patterned layer 11. The thickness of the thin crosslinked layer 13b on horizontal surfaces of the first patterned resist layer 11 is assumed to be equal to the thickness of the thin crosslinked layer on the vertical sidewalls of holes 12a, 12c, 12d, and 12f. The presence of the thin crosslinked layer 13b forms a second space width $W_4$ in the holes 12a, 12c, 12d, 12f that is less than $W_2$ and may not be attainable by a single conventional patterning technique.

Note that the width of the crosslinked plug 13a is larger than the first space width $W_2$ in the holes 12b, 12e to allow for some error in the overlay of the negative resist pattern on the first patterned resist layer 11. Therefore, it is not necessary to use the same wavelength of radiation 17 for exposing the water soluble negative tone resist layer 13 as was employed for exposing the first resist layer 11. Generally, a more economical method is to use a longer exposing wavelength for the second exposure, if possible. For instance, a 193 nm wavelength might be used to pattern the first resist layer 11 to form holes 12a-12f between 100 and 130 nm in space width $W_2$ while a 248 nm wavelength may be employed for exposing the water soluble negative resist layer 13 to form crosslinked plugs 13a that are between about 130 nm and 250 nm in width.

The pattern density in regions 18a, 18c has been reduced by one hole per region by forming the second patterned layer with crosslinked plugs 13a in unwanted holes 12b, 12e. In an alternative embodiment where a plurality of holes are formed per region in the first patterned resist layer 11, more than one unwanted hole may be removed per region by forming a plurality of crosslinked plugs in a second patterned layer that overlies the first patterned resist layer 11. In an embodiment where at least two of the regions having a plurality of holes also have the same size and the same number of holes (equal pattern densities) in the first patterned resist layer 11, then a different number of unwanted holes must be removed (plugged) in the two regions to form at least two different pattern densities in the second patterned layer. Those skilled in the art recognize that a variety of options exist in which different numbers of unwanted holes may be plugged in each of the plurality of regions.

An advantage over prior art is that all the holes 12a, 12c, 12d, 12f have the same reduced space width $W_4$ whereas in conventional methods, the isolated holes 12a, 12f have a different size $W_4$ than the dense holes 12c, 12d.

Figure 5:
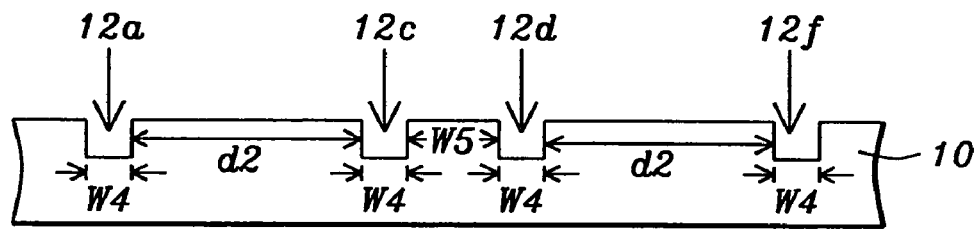

Referring to FIG. 5, the substrate 10 is then anisotropically etched by an appropriate plasma etch method which is determined by the composition of the substrate 10 and is well known to those skilled in the art. The second patterned resist layer comprised of the crosslinked plugs 13a and the thin crosslinked layer 13b function as an etch mask for the transfer of the hole pattern into substrate 10. In an embodiment where the etch breaks through the thin crosslinked layer 13b, the first patterned resist layer serves as an etch mask. Once the pattern having the second pattern density has been etched to an appropriate depth into the substrate 10, the remaining first patterned resist layer 11, the thin crosslinked layer 13b, and crosslinked plugs 13a are stripped by a conventional method. The holes 12b, 12e are not formed in the substrate 10 because the crosslinked plugs 13a block the plasma etch.

As a result of the etch step, the holes 12a, 12c, 12d, 12f in the substrate 10 have a space width $W_4$ that has been reduced from $W_2$ in the first patterned resist layer 11. In addition, the pattern density in regions 18a, 18c has been reduced while the pattern density remains the same in the region 18b. Therefore, a pattern has been produced in the substrate 10 in which the holes 12a, 12c, 12d, 12f have the same reduced space width but region 18a and region 18c have a different pattern density than the region 18b. Note that other holes (not shown) in the first patterned resist layer 11 with a space width $W_X$ that is equal to or different than $W_2$ will also shrink by an amount equal to $(W_2-W_4)$. Optionally, the second mask for exposing the water soluble negative resist layer 13 may be designed to remove unwanted holes (not shown) in other regions with a space $W_X$ unequal to $W_2$. In other words, the second mask may have a pattern with holes of one space width to remove unwanted holes in the first patterned resist layer 11 with a space width $W_2$ and the second mask may have holes of another space width to remove unwanted holes in the first patterned layer having a space width $W_X$.

A method has thus been demonstrated whereby holes may be selectively removed in a first patterned layer by forming a second patterned layer on the first patterned layer. The pattern in the second patterned layer is transferred into a substrate to decrease the pattern density in at least one of the regions of the substrate while simultaneously reducing the space width of all the remaining holes. The method also anticipates the use of phase shifting masks and resolution enhancement techniques to provide higher resolution and a larger process window in the patterning process. Furthermore, the method is not limited by the space width of a hole in the first patterned layer and can be applied to plug holes as small as 130 nm or less. Moreover, the method of this invention is more versatile than prior art methods that only reduce the space width in an opening or only adjust the pattern density in a resist layer.

In a second embodiment illustrated in FIGS. 6-9, a method is described that relates to shrinking the space width of holes in at least two regions of a first resist pattern having equal pattern densities and equal space widths whereby a second pattern is formed in a substrate in which the two regions have holes with different pattern densities but equal and smaller space widths. In other words, a reduced pattern density is formed in at least one of the substrate regions and all holes formed in the substrate have reduced space widths compared to the first resist pattern.

Figure 6:
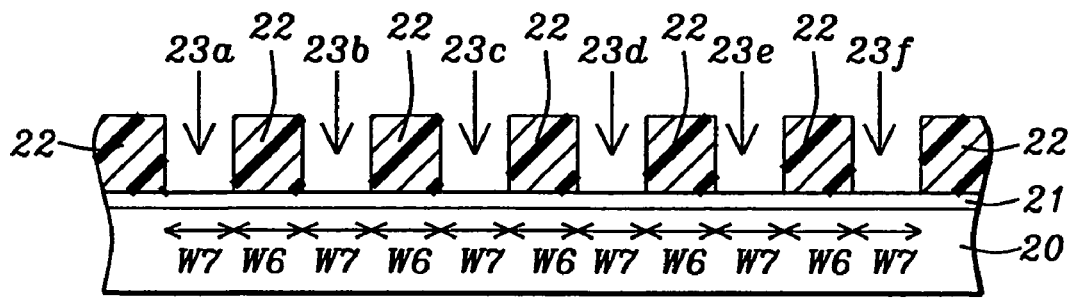
FIGS. 6-9 are cross-sectional views showing various steps of a second embodiment of the present invention in which the space width and pattern density of holes in a first resist pattern are reduced in a second pattern formed in a substrate.

Referring to FIG. 6, a substrate 20 is provided that is typically comprised of silicon and may contain active and passive devices in a substructure that is not shown in order to simply the drawing. An anti-reflective coating (ARC) 21 is formed on the substrate 20 in order to control reflectivity during a subsequent resist patterning process. The ARC 21 may be an inorganic material such as silicon nitride or silicon oxynitride that is deposited by a CVD process or the like or the ARC may be an organic layer that is obtained by spin coating and baking a commercially available ARC solution.

A positive tone resist is spin coated on ARC 21 and baked to form a first resist layer 22 which normally has a thickness in the range of about 2000 to 10000 Angstroms. The resist thickness is usually determined by the minimum feature size in the device pattern to be printed in the first resist layer 22 as is appreciated by those who practice the art. The type of first resist layer 22 selected also depends on the dimension of the smallest feature to be printed by the lithographic process as described in the first embodiment.

The first resist layer 22 is exposed through a first mask (not shown) comprised of a hole pattern that projects an aerial image on the first resist layer 22. The holes may be vias, contact holes, trenches, or other openings used in the art. The mask may be an Att-PSM or Alt-PSM, or an Att-PSM, Alt-PSM, or binary mask with scattering bars to increase the process window of the patterning method. Radiation from an exposure source (not shown) passes through transparent regions of the mask to expose selected regions of the first resist layer 22. Although 193 nm, 248 nm, and 365 nm exposure tools are preferred for most current lithography applications, it is understood that any exposure wavelength in the range from 10 nm to about 600 nm is included in the scope of this invention. Optionally, an e-beam exposure tool that may involve a direct write technique or a projection method may be used to form a pattern in first resist layer 22.

In the embodiment where the exposure involves Deep UV or sub-200 nm wavelengths, the first resist layer 22 is a preferably a chemically amplified resist and a PEB at temperatures from about 90° C. to 150° C. is performed following exposure to accelerate an acid catalyzed reaction. The substrate 20 is then developed with water or an aqueous base solution to form a first patterned resist layer 22 with holes 23a-23f having a width $W_7$ and separated by a distance $W_6$ where the ratio $W_6/W_7$ may vary from approximately 1 for a high pattern density to a number of 10 or more for a low pattern density. Patterns with intermediate $W_6/W_7$ ratios are referred to as semi-dense or semi-isolated.

In many applications, it is desirable to print holes with the same space width but with different pattern densities. In prior art methods when a single mask having holes of equal space width is used to print a pattern with different pattern densities, isolated holes (low pattern density) are usually printed with a smaller space width than dense arrays of holes (high pattern density). In the present invention, holes with equal space width are printed with a first pattern density in a first resist layer and then unwanted (dummy) holes are removed so that the remaining holes in a second pattern in a second resist layer which are transferred into a substrate have equal space widths but different pattern densities. The method of this embodiment is particularly useful for generating a more uniform space width in holes that have different pattern densities without the need for OPC.

Referring to FIG. 6, the holes 23a-23f are formed with the same space width $W_7$ in a first patterned resist layer 22 where they are separated by a constant distance $W_6$ and have a first pattern density. It is understood that the pattern may be further comprised of other regions (not shown) having holes with a space width $W_X$ that are separated from one another by a distance $W_Y$ where $W_X$ may or may not be equal to $W_7$ and $W_Y$ may or may not be equal to $W_6$. In one embodiment, $W_6/W_7$ may be about 1 so that the holes 23a-23f are in a dense array with a high pattern density. The method of this embodiment provides a means of reducing all space widths $W_7$ and $W_X$ by a constant amount while reducing the pattern density of holes in selected regions that may or may not include $W_X$. Alternatively, the holes 23a-23f may be part of a semi-dense or isolated array where $W_6/W_7$ is significantly greater than 1.

In the second embodiment, the pattern density of a first region 29 that includes the holes 23a, 23b, 23c will be reduced by removing the holes 23b, 23c in a second patterned layer that will be subsequently be formed over the first patterned resist layer 22. Meanwhile, the pattern density of a second region 30 with the holes 23d, 23e, 23f will remain unchanged after a second patterned layer is formed. Note that a region is defined as a portion of the substrate 20 and layers overlying that portion of substrate. From a top-down view (not shown), a region has a width and a length and comprises an area as small as approximately 1 square micron to as large as hundreds of square microns. Furthermore, a first region may have a different area than a second region. Those skilled in the art will appreciate an alternative embodiment wherein a plurality of regions each with a plurality of holes may be present in a first patterned resist layer 22 on the substrate 20. To simplify the drawings, only two regions with three holes in each region are shown in the second embodiment.

Figure 7:
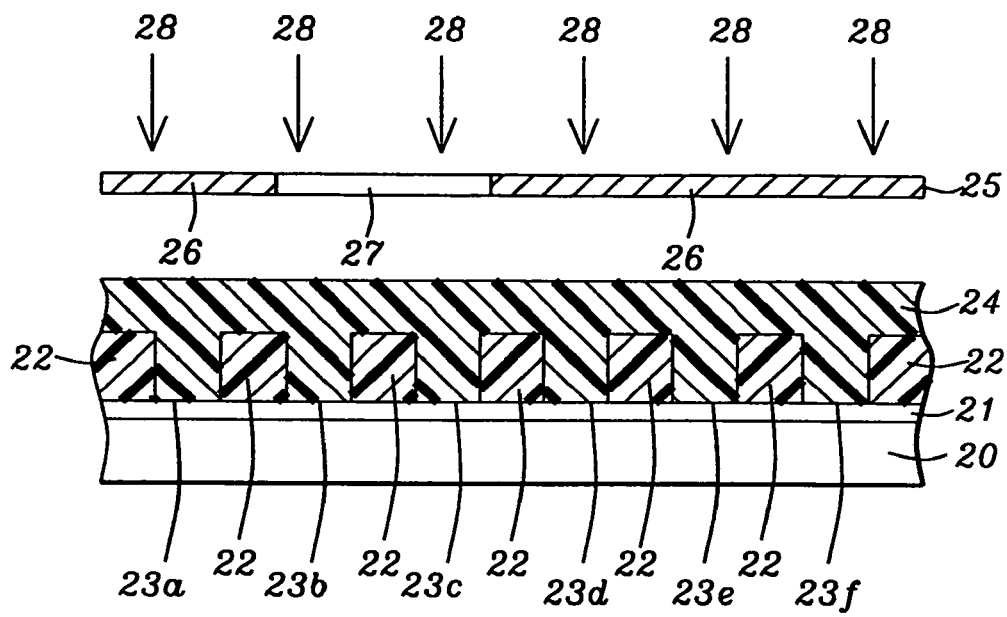

In FIG. 7, a water soluble negative resist is coated on the first patterned resist layer 22 and baked to form water soluble negative resist layer 24. The negative resist solution is typically comprised of a water solvent, a polymer having polar functionality such as an hydroxy group, a PAG, and preferably has a quencher which is usually a non-nucleophilic base such as an amine or a nitrogen containing compound that controls acid diffusion in the exposed resist film and acts as an acid scavenger to prevent acid catalyzed reactions from occurring in the resist solution. The polymer is further characterized as having a polar group that undergoes an acid catalyzed rearrangement or an acid induced cleavage such that the resulting polymer is no longer soluble in water. Such polymers and water soluble negative resists are known in prior art and examples thereof are included in the compositions described earlier in U.S. Pat. Nos. 5,998,092 and 5,017,461. Since the water soluble negative resist layer 24 is coated from a water solution, it does not mix with the first patterned resist layer 22 during the coating and baking operation above.

The water soluble negative resist layer 24 is baked at a temperature in the range of about 80° C. to 150° C. in order to dry the film after spin coating and is then exposed through a second mask 25. In one embodiment, the second mask 25 is a binary mask that comprised of a pattern that includes primarily opaque regions 26 and small transparent regions 27 corresponding to locations of the unwanted holes 23b, 23c in FIG. 6. The second mask 25 may be further comprised of scattering bars to improve resolution and the process window of the patterning step. Alternatively, the second mask 25 is an att-PSM or alt-PSM in which the region 26 transmits light that is 180° out of phase with light transmitted through the region 27. Although 193 nm, 248 nm, and 365 nm exposure tools are preferred for most current lithography applications, it is understood that any wavelength 28 in the range from 10 nm to about 600 nm may be used for this step. Furthermore, the exposure may include resolution enhancement techniques such as off-axis illumination to increase the process window of the patterning step.

Figure 8:
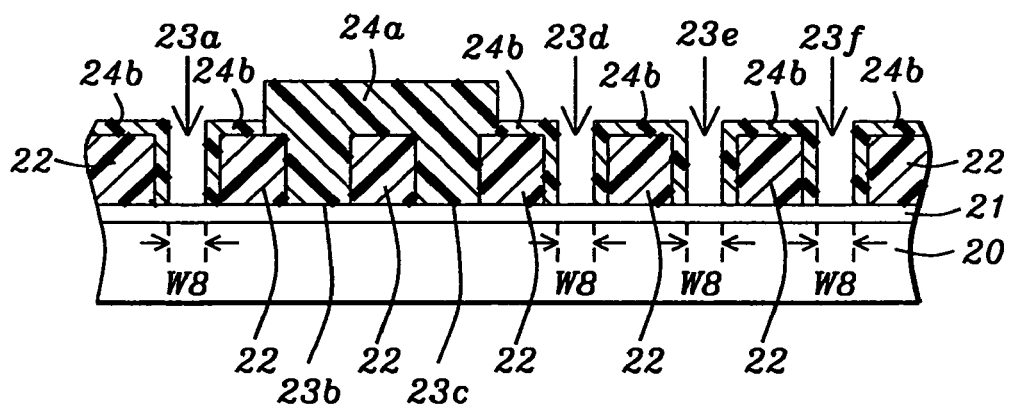

Referring to FIG. 8, the polymer in the water soluble negative resist layer 24 is transformed in exposed regions during the exposure and post-expose baking step to produce a water insoluble resist plug 24a. The PAG generates a strong acid in exposed areas which catalyzes a cleavage or rearrangement within the polymer to produce a polymer product that is non-polar and which is no longer soluble in water. Therefore, when an aqueous or isopropanol/water developer is applied to the substrate 20 following a post-expose bake, only regions of the water soluble negative resist layer 24 that have unreacted polymer are removed. A thin water insoluble layer 24b is formed because residual acid in the first patterned resist layer 22 diffuses into adjacent regions of the water soluble negative resist layer 24 during the PEB step to induce a cleavage or rearrangement that changes the polymer polarity from polar to non-polar. The quencher loading of the water soluble negative resist layer 24 may be adjusted downward if a larger thickness of the thin water insoluble layer 24b is desired or upward if a smaller thickness of the thin water insoluble layer 24b is required. PEB time and temperature may also be changed to control the thickness of the thin water insoluble layer 24b which determines the amount of shrinkage in the holes 23a, 23d, 23e, 23f.

A second patterned layer comprised of the water insoluble plugs 24a and the thin water insoluble layer 24b is thereby formed on the first patterned resist layer 22. The thickness of the thin water insoluble layer 24b on horizontal surfaces of the first patterned resist layer 22 is assumed to be equal to the thickness of the thin water insoluble layer on the vertical sidewalls of the holes 23a, 23d, 23e, and 23f. The presence of the thin water insoluble layer 24b forms a second space width $W_8$ in the holes 23a, 23d, 23e, 23f that is less than $W_7$ and may not be attainable by a single conventional patterning technique.

Note that the width of the water insoluble plug 24a is larger than the first space width $W_7$ of holes 23b, 23c to allow for some error in the overlay of the negative resist pattern in the second mask 25 on the first patterned resist layer 22. Therefore, it is not necessary to use the same wavelength of radiation 28 for exposing the water soluble negative tone resist layer 24 as was employed for exposing the first resist layer 22. Generally, a more economical method is to use a longer exposing wavelength for the second exposure, if possible. For instance, a 193 nm wavelength might be used to pattern the first resist layer 22 to form holes 23a-23f between 100 and 130 nm in space width $W_7$ while a 248 nm wavelength may be employed for exposing the water soluble negative resist layer 24 to form the water insoluble plugs 24a that may be between 130 nm and 250 nm in width.

The pattern density in the region 29 has been reduced by two holes by forming the second patterned layer with the water insoluble plugs 24a in the unwanted holes 23b, 23c. In an alternative embodiment where a plurality of holes are formed per region in the first patterned resist layer 22, only one hole or a plurality of holes may be removed per region by forming an appropriate number of water insoluble plugs in a second patterned layer that overlies the first patterned resist layer 22. In an embodiment where at least two of the regions having a plurality of holes also have the same size and the same number of holes (equal pattern densities) in the first patterned resist layer 22, then a different number of unwanted holes must be removed (plugged) in the two regions to form at least two different pattern densities in the second patterned layer. Those skilled in the art recognize that a variety of options exist in which different numbers of unwanted holes may be plugged in each of the plurality of regions. An advantage over prior art is that all the holes 23a, 23d, 23e, 23f have the same reduced space width $W_8$ whereas in conventional methods, an isolated hole 23a has a different size $W_8$ than the dense holes 23d, 23e, 23f.

Figure 9:
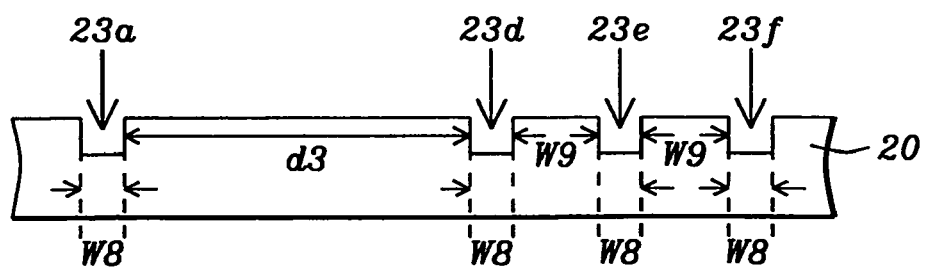

Referring to FIG. 9, an ARC 21 open step is then performed with a plasma etch that typically involves oxygen if the ARC 21 is an organic layer. The etch removes the ARC 21 exposed by the holes 23a, 23d, 23e, 23f and stops on the substrate 20. The substrate 20 is then anisotropically etched by an appropriate plasma etch method known to those skilled in the art. The second patterned resist layer comprised of the water insoluble plugs 24a and the thin water insoluble layer 24b function as an etch mask for the transfer of the hole pattern into the substrate 20. In an embodiment where the etch breaks through the thin water insoluble layer 24b, the first patterned resist layer 22 serves as an etch mask. Once the pattern having the second pattern density has been etched to an appropriate depth into the substrate 20, the remaining first patterned resist layer 22, the thin water insoluble layer 24b, water insoluble plugs 24a, and the ARC 21 are stripped by a conventional method such as a wet stripper or oxygen ashing. The holes 23b, 23c are not formed in the substrate 20 because the water insoluble plugs 24a block the plasma etch.

As a result of the etch step to transfer the pattern in the second patterned layer into the substrate 20, the holes 23a, 23d, 23e, 23f in the substrate 20 have a space width $W_8$ that has been reduced from $W_7$ in the first patterned resist layer 22. In addition, the pattern density in the region 29 has been reduced while the pattern density remains the same in the region 30. Therefore, a pattern has been produced in the substrate 20 in which the holes 23a, 23d, 23e, 23f have the same reduced space width but the region 29 has a different pattern density than the region 30. Note that other holes (not shown) in the first patterned resist layer 22 with a space width $W_X$ that is equal to or different than $W_7$ will also shrink by an amount equal to ($W_7$-$W_8$). Optionally, the second mask for exposing the water soluble negative resist layer 24 may be designed to remove unwanted holes (not shown) in other regions with a space $W_X$ unequal to $W_7$. In other words, the second mask may have a pattern with holes of one space width to remove unwanted holes in the first patterned resist layer 22 with a space width $W_7$ and the second mask may have holes of another space width to remove unwanted holes in the first patterned layer having a space width $W_X$.

A method has thus been demonstrated whereby holes may be selectively removed in a first patterned resist layer by forming a second patterned layer on the first patterned resist layer. The pattern in the second patterned layer is transferred into a substrate to decrease the pattern density in at least one of the regions of the substrate while simultaneously reducing the space width of all the remaining holes. The method also anticipates the use of phase shifting masks and resolution enhancement techniques to provide higher resolution and a larger process window in the patterning process. Furthermore, the method is not limited by the space width of a hole in the first patterned layer and may be applied to plug holes as small as 130 nm or less. Moreover, the method of this invention is more versatile than prior art methods that only reduce the space width in an opening or only adjust the pattern density in a resist layer.

While this invention has been particularly shown and described with reference to, the preferred embodiment thereof, it will be understood by those skilled in the art that various changes in form and details may be made without departing from the spirit and scope of this invention.

We claim:

1. A water soluble negative resist comprising:
   (a) a water/isopropanol solvent mixture containing about 4 to 8 weight % of poly(vinylacetal);
   (b) about 0.5 to 2 weight % of ethylene urea as a crosslinker;
   (c) about 0.01 to 0.1 weight % of a photoacid generator; and
   (d) about 1 to 30 ppm of a quencher.

2. The water soluble negative resist of claim 1 wherein the photoacid generator is selected from the group consisting of onium salts, imidosulfonates, and diazoketone sulfonates.

3. The water soluble negative resist of claim 1 wherein the quencher is selected from a group consisting of amines, nitrogen containing compounds and derivatives thereof.

4. The water soluble negative resist of claim 1 wherein the poly(vinylacetal) having the chemical composition of:

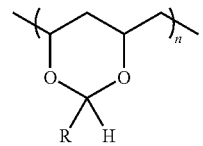

wherein R is an alkyl group and n indicates the degree of polymerization.

* * * * *